(12) United States Patent
Bezama et al.

(10) Patent No.: US 7,992,627 B2
(45) Date of Patent: *Aug. 9, 2011

(54) MICROJET MODULE ASSEMBLY

(75) Inventors: Raschid J. Bezama, Mahopac, NY (US); Govindarajan Natarajan, Poughkeepsie, NY (US); Kamal K. Sikka, Poughkeepsie, NY (US); Hilton T. Toy, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

This patent is subject to a terminal disclaimer.

(21) Appl. No.: 12/338,092

(22) Filed: Dec. 18, 2008

(65) Prior Publication Data
US 2009/0095444 A1   Apr. 16, 2009

Related U.S. Application Data

(63) Continuation of application No. 10/908,622, filed on May 19, 2005, now Pat. No. 7,516,776.

(51) Int. Cl.
*H05K 7/20* (2006.01)
(52) U.S. Cl. .................. 165/80.4; 165/908; 361/699
(58) Field of Classification Search .............. 165/80.4, 165/908; 361/699
See application file for complete search history.

(56) References Cited

U.S. PATENT DOCUMENTS

| | | | |
|---|---|---|---|
| 3,909,118 A | 9/1975 | Schmidt | |
| 4,209,129 A | 6/1980 | Haas et al. | |
| 4,494,171 A | 1/1985 | Bland et al. | |
| 4,910,642 A | 3/1990 | Downing | |
| 5,249,358 A | 10/1993 | Tousignant et al. | |
| 5,269,372 A | 12/1993 | Chu et al. | |
| 5,270,572 A | 12/1993 | Nakajima et al. | |
| 5,316,075 A | 5/1994 | Quon et al. | |
| 6,431,260 B1 | 8/2002 | Agonafer et al. | |
| 6,459,581 B1 | 10/2002 | Newton et al. | |
| 6,550,263 B2 | 4/2003 | Patel et al. | |
| 6,650,542 B1 | 11/2003 | Chrysler et al. | |
| 6,650,235 B2 | 2/2006 | Slocum et al. | |
| 2002/0163782 A1 | 11/2002 | Cole et al. | |
| 2006/0042825 A1 | 3/2006 | Lu et al. | |
| 2006/0175041 A1 | 8/2006 | Johnson et al. | |
| 2006/0250774 A1 | 11/2006 | Campbell et al. | |

*Primary Examiner* — Allen J Flanigan
(74) *Attorney, Agent, or Firm* — DeLio & Peterson, LLC; Kelly M. Nowak; Joseph Petrokaitis

(57) ABSTRACT

Low-pressure drop thermal assemblies, systems and methods of making low-pressure drop thermal assemblies for use in high power flux situations. A manifold body is attached to a distributor to form a subassembly. This subassembly is in communication with a substrate surface, which has a semiconductor device in need of thermal management thereon. An enclosed cavity is formed between the target substrate surface and the subassembly, and a seal of the cavity protects critical components residing on the active surface of the semiconductor device. The distributor includes a distributed liquid impingement microjet inlet array isolated from and parallel with a distributed microjet drain array for impinging cooling fluid and removing spent heated fluid in a direction orthogonal to a target surface for maximizing the heat transfer rate, and thereby providing high cooling flux capabilities while enabling low-pressure drops.

21 Claims, 5 Drawing Sheets

MICROJET MODULE ASSEMBLY

BACKGROUND OF THE INVENTION

1. Field of the Invention

The present invention relates to the heating and/or cooling of high power dissipating devices, such as semiconductor chips, and in particular, to a low pressure drop thermal device for microjet liquid impingement with distributed returns and methods of manufacturing the same.

2. Description of Related Art

It has been found that conventional thermal technologies for cooling electronic devices, such as, heat spreaders, heat sinks, and associated thermal interfaces, are generally not scalable to meet the demands of modern electronic devices. These modern electronic devices include those having increased power densities, operating frequencies and current leakages, as well as devices having small cooling fluid thermal budgets or having very high average power flux. For instance, in an electronic device having a high average power flux, a high power hot spot may dissipate 300 to 500 W/cm$^2$, while a very high power hot spot may dissipate more than 500 W/cm$^2$. Under such processing conditions, if the cooling method is primarily based on a heat conduction mechanism, the power flux will be undesirably large such that it generates significant thermal gradients along the cooling axis.

Due to the possibility of these significant thermal gradients along the cooling axis, acceptable cooling techniques typically require the use of a single-phase fast-forced convection and/or a two-phase evaporation based device with a circulating fluid. Yet, current higher cooling solutions often require a high fluid flow rate, which in turn, results in an undesirable increase in pressure drop on the cooler (fluid inlet to the outlet pressure difference). Also, known circulating cooling fluid solutions have a maximum operating pressure for preventing fluid leakage and mechanical damage to the system. As such, the extendibility of conventional cooling solutions is deleteriously limited by the pressure drop required to operate modern electronic devices having high power flux situations.

Prior art has focused on thermal structures having impinging liquid jets. For instance, FIG. 1 shows a conventional heating/cooling device 1. This thermal structure includes a perforated plate 6 having an array of fluid jets 4 that impinge orthogonally on a surface 3 of a substrate 2, such as a semiconductor chip or an interface between the jets and body to be cooled, and a lateral drain 5 for removing spent fluid. The fluid jet array 4 provides a high heat transfer rate when used to heat or cool the substrate surface 3, as compared to conventional convection heating and/or cooling processes.

In this scenario, the high kinetic energy of the array of fluid jets 4 provides fresh jet fluid in close proximity to the surface 3 in the region directly below the array of jets, generally at the center of the electronic component. This enables high heating or cooling rates at such regions. However, the high heating/cooling transfer rates decrease rapidly in areas of the surface 3 not residing directly below the surface area impinged by the jet fluid. This undesirably results in uneven cooling across the surface of the electronic component, especially from the center to the edge of the electronic component.

Conventional heating and/or cooling devices also commonly employ an array of fluid jets in combination with lateral drains 5. These lateral drains 5 are insufficient for cooling high power flux situations due to the lack of proper spent fluid drainage. In particular, the lateral drains 5 remove spent fluid in a radial flow pattern away from a fluid jet at the center of the surface. In so doing, the drain velocity increases approximately linearly with the number of fluid jet rows encountered from the central jet row(s) to the fluid drain outlet located at the periphery of such jet array, thereby reaching a maximum velocity at such periphery. Attempts have been made to resolve the resulting temperature gradient by placing the inlet fluid jets close to one another, but when these inlet microjets are placed too close together interactions between adjacent jets degrades the thermal performance of the array.

Current fluid jet arrays are also impractical for cooling high power flux situations due to their structural designs. Conventional single-phase jet array structural designs limit the drain velocity such that it does not exceed 50% of the fluid jet array velocity. Drain velocities above 50% of the fluid jet array velocity undesirably force the fluid jets to move away from the desired orthogonal orientation, thereby reducing the heat transfer rate by more than 20% relative to the heat transfer rate of a fully orthogonally oriented jet. This problem increases significantly in two-phase coolers, where the gas phase volumetric flow can be up to three orders of magnitude larger than the liquid flow.

Another disadvantage of conventional heating and/or cooling devices is that they do not protect the components on the semiconductor device in need of thermal management, such as, chips, interconnects, modules, integrated circuits, transistors, resistors, and the like, which reside on the semiconductor device surface opposite the surface being impinged.

In view of the foregoing, a need exists for improved methods of maximizing the heat transfer rate of fluid jet arrays for cooling/heating components having high power flux, which generate significant thermal gradients along the targeted surface, while controlling the pressure drop in the liquid cooling modules and protecting the critical semiconductor hierarchy in need of thermal management.

SUMMARY OF THE INVENTION

Bearing in mind the problems and deficiencies of the prior art, it is therefore an object of the present invention to provide thermal assemblies, systems and methods of making thermal assemblies that maximize the heat transfer rate in a high power dissipating assembly for a given pressure drop.

It is another object of the present invention to provide thermal assemblies, systems and methods of making thermal assemblies having impinging microjets and distributed returns for use in high power flux situations.

Yet another object of the present invention is to provide thermal assemblies, systems, and methods of making thermal assemblies having sufficiently high cooling flux capabilities while enabling low-pressure drops.

Still another object of the present invention is to provide thermal assemblies, systems and methods of making thermal assemblies having distributed microjets parallel with distributed via drain returns for impinging cooling fluid and removing spent heated fluid in a direction orthogonal to a target surface for maximizing the heat transfer rate.

It is another object of the present invention to thermal assemblies, systems and methods of making thermal assemblies that isolate the cold and hot fluids in separate regions within the thermal module to prevent mixing of such cold and hot fluids.

Yet another object of the present invention is to provide thermal assemblies, systems and methods of making thermal assemblies that isolate the active or functional side from rest of the thermal assembly to prevent fluid leakage onto the active or functional side.

Another object of the present invention is to thermal assemblies, systems and methods of making thermal assemblies that encase a microjet substructure within a fluid distribution system for constant pumping and circulation of the cooling fluid during the chip cooling process.

Still another object of the present invention is to provide thermal assemblies, systems and methods of making thermal assemblies that are capable of cooling at a rate above about 100 cm$^2$ for high power dissipating semiconductor devices and simultaneously assures the mechanical integrity by limiting the internal liquid pressure drop below 10 psi.

It is another object of the present invention to provide thermal assemblies, systems, and methods of making thermal assemblies that enable functional testing of semiconductor devices.

Yet another object of the present invention is to provide thermal assemblies, systems and methods of making thermal assemblies that increase the thermal performance by providing a grooved surface in association with microjets with distributed returns.

Still other objects and advantages of the invention will in part be obvious and will in part be apparent from the specification.

The above and other objects, which will be apparent to those skilled in art, are achieved in the present invention, which is directed to a low-pressure drop thermal assembly for thermal management of a semiconductor. This low-pressure drop thermal assembly includes a subassembly that comprises a manifold directly attached to a distributor. The manifold has an inlet opening isolated from an outlet opening, while the distributor has an inlet microjet array isolated from an outlet microjet array, whereby each inlet microjet is adjacent at least three outlet microjets. The manifold is attached to the distributor such that the inlet opening communicates with the inlet microjet array and the outlet opening communicates with the outlet microjet array. A substrate surface is in communication with this subassembly, whereby a semiconductor device is on the substrate surface. The semiconductor device has a first and second surface. The first surface is orthogonal to an input, output direction flow of a fluid input by the microjet input array and output by the distributed microjet outlet array, while the second surface has hierarchy thereon (e.g., chips, interconnects, modules, integrated circuits, transistors, resistors, and the like). A cavity resides between the subassembly and the substrate surface, whereby a seal of such cavity protects the hierarchy from the fluid.

The manifold may be metal, while the distributor may be a material such as glass-ceramic material, silicon, AlN, SiC, Cu, Ni, alloys thereof, or combinations thereof. The low-pressure drop thermal assembly may also include a frame around the subassembly of the manifold attached to the distributor, whereby this frame is sealed to the substrate surface to provide the cavity. In this aspect, the cavity may be a closed cavity. For instance, the seal may be an o-ring surrounding the frame, or a flexible plate within the cavity surrounding the semiconductor device, whereby this flexible plate protects the hierarchy on the second surface of the semiconductor device from the fluid. Alternatively, the seal may be a material encapsulating peripheral edges of the semiconductor device to protect the hierarchy.

In another aspect, the invention is directed to a system for thermal transfer. This system includes a manifold body, distributor, substrate, semiconductor device, enclosed cavity and a seal. The manifold body has an inlet opening isolated from an outlet opening, while the distributor has an inlet microjet array parallel with and isolated from an outlet microjet array. The manifold body is attached to the distributor such that the inlet opening communicates with the inlet microjet array and the outlet opening communicates with the outlet microjet array. The substrate has a surface connected to the manifold body, whereby the semiconductor device is on the substrate surface. The enclosed cavity resides between the manifold body and the substrate surface and around the semiconductor device, while the seal is around the semiconductor device. In this system, a fluid flows into the manifold body, through the inlet opening, into the inlet microjet array of the distributor, and orthogonally impinges a first surface of the semiconductor device. Spent fluid flow is then removed from the enclosed cavity in a direction orthogonal to the first surface. This is accomplished by uptake into the outlet microjet array through the outlet opening and out the manifold body. During this flow, the seal protects hierarchy residing on the second surface of the semiconductor device.

In yet another aspect, the invention is directed to a method of forming a thermal assembly for thermal management of a semiconductor device. The method includes providing a manifold body having an inlet opening isolated from an outlet opening, and a distributor having an inlet microjet array parallel with and isolated from an outlet microjet array. An essential feature is that each inlet microjet is adjacent at least three outlet microjets. The inlet opening of the manifold is aligned with the inlet microjet array of the distributor and the outlet opening with the outlet microjet array, and then the manifold is attached to the distributor to form a subassembly. This subassembly is attached to a substrate surface, which has a semiconductor device thereon in need of thermal control, such that a cavity is formed between the subassembly and the substrate surface. A seal of this cavity is provided around the semiconductor device for protecting hierarchy residing on a second surface of said semiconductor device.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 2A-6 of the drawings in which like numerals refer to like features of the invention.

The present invention is directed to low-pressure drop thermal assemblies, and methods of making the same, whereby these assemblies have a liquid impingement microjet inlet array isolated from a distributed microjet outlet or drain array for use in high power flux situations. These assemblies advantageously maximize the heat transfer rate in a high power dissipating assembly, and simultaneously assuring the mechanical integrity by limiting the fluid pressure drop below 10 psi. The thermal assemblies of the invention also isolate the active, i.e., functional side, of the semiconductor device from the rest of the thermal assembly to prevent fluid leakage onto such active side.

As shown in FIGS. 2A-D, a fluid distribution structure 15 is an essential component of the present low-pressure drop thermal assemblies. It should be appreciated that fluid distribution structure 15 is a thermal device that may be used for cooling targeted surfaces and/or heating such surfaces. For ease of understanding the invention, the fluid distribution structure 15 is described herein as a cooling device. However, it should be appreciated that the fluid distribution structure 15 may also be a heating device, or a combination of a cooling device and a heating device.

Figure 1:
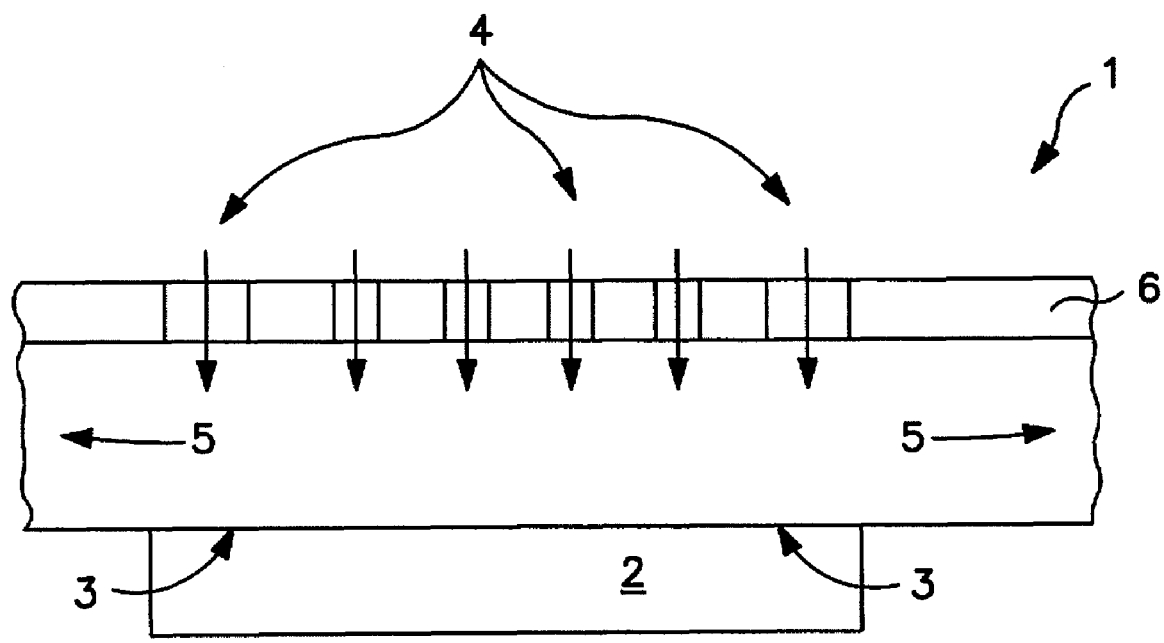
FIG. 1 is a prior art illustration of a side view of a conventional cooling manifold having lateral drains for removing spent cooling fluid.
Figure 2A:
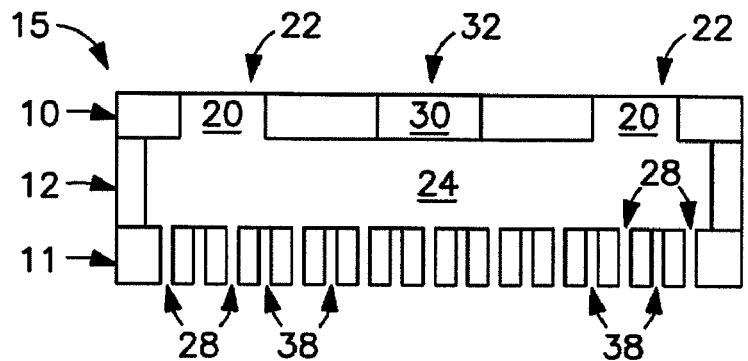
FIG. 2A is a side view of a fluid distribution structure of the invention having a distributed fluid inlet microjet array parallel with a distributed fluid outlet microjet drain array.
Figure 2B:
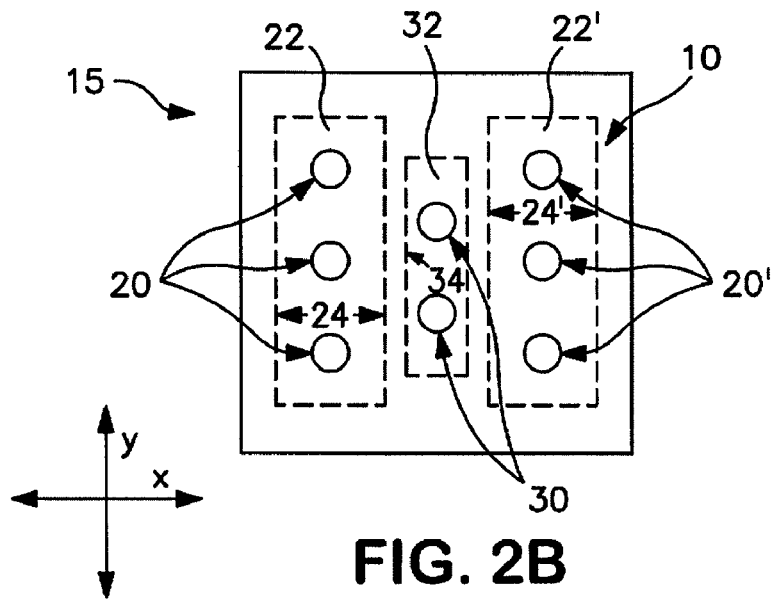
FIG. 2B is a top plan view across segment 10 of the distributor of FIG. 2A showing fluid inlet holes integral with fluid inlet manifolds being separate and isolated from fluid outlet holes integral with a fluid outlet manifold.

The fluid distribution structure 15 has three unique portions. The top portion 10 includes a number of fluid inlet holes 20, 20' and a number of fluid outlet holes 30 traversing therethrough. FIG. 2B shows these fluid inlet holes 20, 20' and fluid outlet holes 30 from a top plan view, while FIG. 2A shows a side view of a pair of the fluid inlet holes 20 and a fluid outlet hole 30 along the y-axis of FIG. 2B. The fluid inlet holes 20, 20' reside in the top portion 10 of the fluid distribution structure 15 within fluid inlet manifold bodies 22, 22', which are designated for the inlet of cooling fluid. Similarly, the fluid outlet holes 30 reside within a fluid outlet manifold body 32 in the top portion of the distributor, which is designated for the outlet of heated or spent fluid.

Figure 2C:
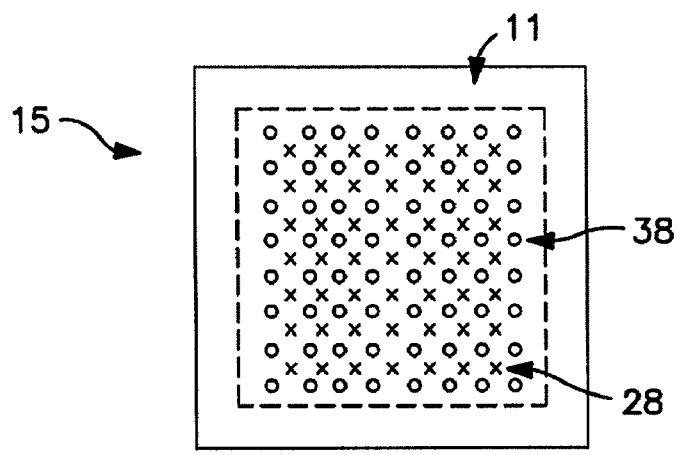
FIG. 2C is a top plan view across segment 11 of the distributor of FIG. 2A showing the distributed fluid inlet and fluid outlet arrays, whereby adjacent fluid inlet microjets are separated from one another by the distributed fluid outlet microjet drains.
Figure 2D:
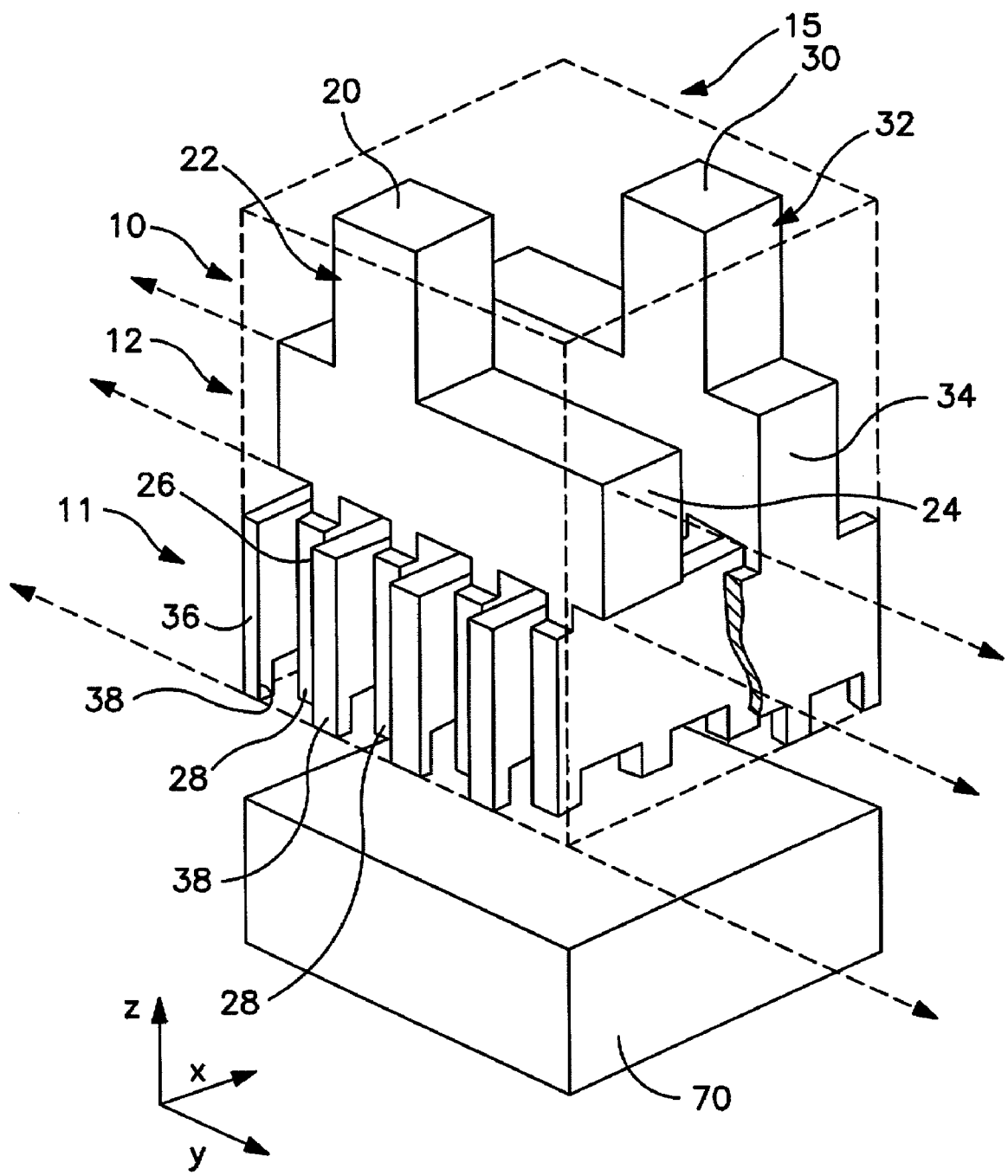
FIG. 2D is a partial perspective view of the distributor of FIG. 2A showing the fluid inlet manifolds having the fluid inlet holes and fluid inlet microjet array for inputting cooling fluid being separate from and intertwined with the fluid outlet manifolds having the fluid outlet holes and fluid outlet microjet drain array for removing spent heated fluid.

Referring to FIG. 2D, it should be appreciated that manifolds 22, 22' and 32 are composed of a number of openings, such as channels, via holes and the like, of equivalent or varied dimensions. These manifolds are intertwined with each other and are physically separated from one another by varying solid walls of thickness within the fluid distribution structure 15. In accordance with the invention, the fluid inlet manifold bodies 22, 22' and the fluid outlet manifold 32 each have at least one fluid inlet hole 20, 20' and one fluid outlet hole 30, respectively, whereby the fluid outlet manifold 32 is positioned between the two fluid inlet manifold bodies 22, 22'. Preferably, as shown in FIG. 2B, the fluid inlet manifold bodies 22, 22' each have three fluid inlet holes 20, 20', and fluid outlet manifold 32 has two fluid outlet holes 30. In this manner, the fluid outlet manifold 32 is positioned between the two fluid inlet manifold bodies 22, 22' such that each fluid outlet hole 30 is surrounded by fluid inlet holes 20, 20'. Further, an essential feature of the fluid distribution structure 15 is that it has more fluid inlet holes 20, 20' than fluid outlet holes 30 for managing the input of cooling fluid and output of spent fluid while maintaining a minimum pressure drop.

Within the middle portion 12 of the fluid distribution structure 15, the fluid inlet holes 20, 20' of the inlet manifolds 22, 22' open into y-axis inlet channels 24, 24', while the fluid outlet holes 30 open into a y-axis outlet channel 34 of the outlet manifold 32. The fluid distribution structure 15 has at least one y-axis inlet channel 24 for receiving inlet fluid from at least one inlet hole 20, and at least one y-axis outlet channel 34 for receiving outlet spent liquid from at least one outlet hole 30. Referring to the dashed lines of a preferred embodiment in FIG. 2B, the fluid distribution structure preferably has a first y-axis inlet channel 24 for receiving inlet fluid from three inlet fluid holes 20 and a second y-axis inlet channel 24' for receiving inlet fluid from three inlet fluid holes 20', with a y-axis channel 34 there-between. This y-axis outlet channel 34 receives spent fluid from a distributed via return array 38, discussed further below, whereby the spent fluid exits the y-axis outlet channel 34 through two outlet fluid holes 30 in manifold 32.

The y-axis inlet channels and the y-axis outlet channel open into a plurality of via openings within the bottom portion 11 of the fluid distribution structure 15. In the preferred embodiment, the y-axis inlet channels 24, 24' open into an array of distributed fluid inlet microjets while the y-axis outlet channel 34 opens into an array of distributed outlet microjet drains. The fluid inlet microjets 28 and the outlet microjet drains 38 are parallel with each other, and reside within the fluid distribution structure 15 in a direction orthogonal to a substrate surface 70 to which the fluid distribution structure is to be attached to for the cooling thereof. In this manner, the inlet cooling fluid impinges the substrate surface from the plurality of fluid inlet microjets 28 in a direction orthogonal to the target surface for cooling the hot substrate surface. The spent, heated fluid is then removed from the region over the target surface in such orthogonal direction by the plurality of outlet microjet drains 38. As shown in the side view illustrations of the fluid distribution structure 15, the parallel distributed fluid inlet microjets and outlet microjet drains provide the bottom surface of the distributor with a pattern of adjacent, intermixed inlet and outlet microjet openings for providing a thermal assembly with increased thermal performance.

FIG. 2C shows a plan view of the array of distributed fluid inlet microjets 28 and the array of distributed outlet microjet drains 38 within bottom portion 11. As is shown, each fluid inlet microjet 28 is surrounded by at least 3 (three), preferably 4 (four), via outlet drains 38 for decoupling interactions between adjacent fluid inlet microjets. In so doing, wherein a fluid inlet microjet 28 is surrounded by 4 (four) via outlet drains 38, such fluid inlet microjet 28 has ¼ an uptake power of each of the 4 (four) via drains 38 surrounding it, such that, the fluid inlet microjet 28 receives the benefit of an uptake power of 1 (one) entire via outlet drain 38. This is advantageous since the stronger the outlet uptake power around an individual fluid inlet microjet 28, the lower the pressure drop for such fluid inlet microjet for a given set of operating conditions.

The fluid distribution structure 15 may be formed using a glass-ceramic material, silicon, Invar™, AlN, SiC, Cu, Ni and the like, polymers and plastics or even combinations thereof. Preferably, the distribution structure is formed of a material having a TCE that closely matches the TCE of the substrate to which the distribution structure is to be attached. A material that matches the TCE of the target substrate surface is preferred since it facilitates direct sealing between the fluid distribution structure and the target substrate surface. The material of the distribution structure also preferably has a low intrinsic thermal conductivity for minimizing the thermal exchange rate between the cold inlet fluid and the heated outlet fluid in areas of the distribution structure where these two fluid streams are in close proximity to each other. In the preferred embodiment, the fluid distribution structure 15 is formed using a ceramic material by multilayer ceramic (MLC) processing. The ceramic material has an intrinsic thermal conductivity of about 2 W/mK, and a TCE that closely matches the TCE of silicon, or about 3.0 E-6 $K^{-1}$.

Figure 3:
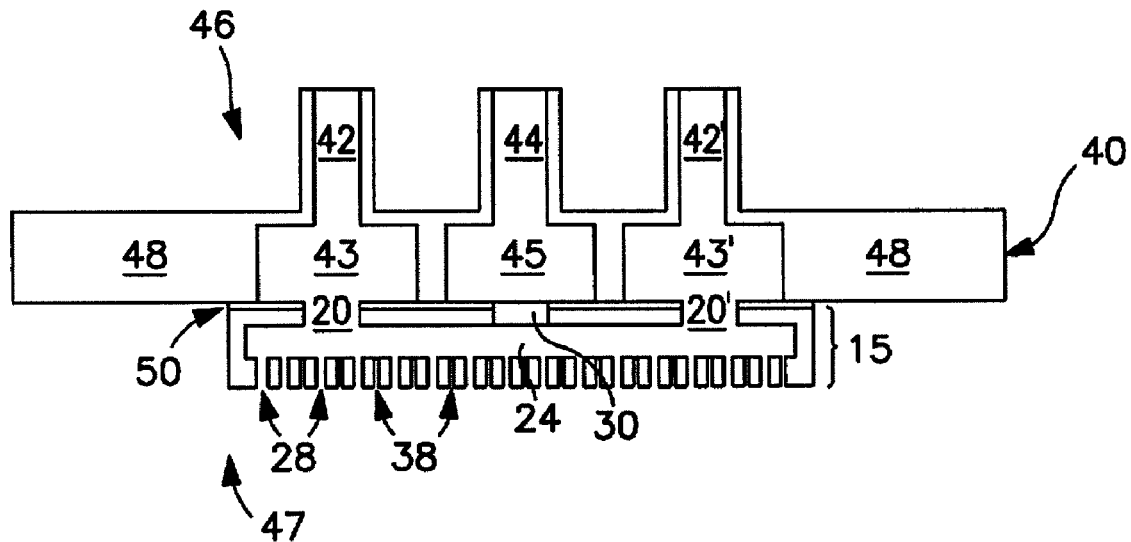
FIG. 3 is a side view showing the fluid distribution structure of FIG. 2A attached to a metal manifold having two fluid inlet pipes connected to two fluid inlet openings that are aligned with the fluid inlet holes of the distributor and having a fluid outlet pipe connected to a fluid outlet opening that is aligned with the fluid outlet drains of the distributor.

FIG. 3 continues the process of forming the present low-pressure drop thermal assembly. As is shown, a metal manifold 40 is attached to the fluid distribution structure 15 of FIGS. 2A-D. This metal manifold 40 may be formed by known techniques such as machining, for example, and may be made of any known metal suitable for formation of a manifold structure for use in semiconductor technologies. In the preferred embodiment, the fluid distribution structure 15 has a ceramic body and the metal manifold 40 has an aluminum body.

The metal manifold 40 includes a number of openings within a metal sheet 48 in locations corresponding to locations of the fluid inlet manifolds and fluid outlet manifolds of the distribution structure 15. The metal sheet 48 is preferably an aluminum body. Referring to FIGS. 2B and 3, the first fluid inlet opening 43 is provided within the manifold body 40 in a location corresponding to the fluid inlet manifold 22 such that all fluid inlet holes 20 within the manifold open into the inlet opening 43. Likewise, the second fluid inlet opening 43' is provided within the manifold body 40 in a location corresponding to the fluid inlet manifold 22' such that all fluid inlet holes 20' within manifold 22' open into the inlet opening 43'. Also, the fluid outlet opening 45 is provided within the metal manifold in a location corresponding to the fluid outlet manifold 32 such that all fluid outlet holes 30 within manifold 32 open into the outlet opening 45.

The metal manifold 40 also includes a fluid inlet pipe over each fluid inlet opening, and a fluid outlet pipe over the fluid outlet opening. The fluid inlet pipe(s) are for inputting cool fluid into the distribution structure 15, while the fluid outlet pipe(s) are for outputting heated, spent fluid from the distribution structure. In a preferred embodiment, as is shown in FIG. 3, fluid inlet pipes 42, 42' are integral with the manifold 40 and extend over the inlet openings 43, 43', while the fluid outlet pipe 44 is also integral with the manifold 40 and extends over outlet opening 45.

A subassembly is formed by attaching the metal manifold 40 to the fluid distribution structure 15 by aligning the fluid inlet openings 43, 43' with the inlet holes 20, 20' of manifolds 22, 22' and aligning the fluid outlet opening 45 with the outlet holes 30 of manifold 32. The manifold 40 and distribution structure 15 are then secured and sealed to one another such that no leakage or exchange of fluids occurs between the cool fluid and heated fluid at the interface of the manifold and distributor. This may be accomplished using an adhesive 50 having suitable strength and flexibility for securely sealing the manifold to the distributor at both high and low temperatures. For example, the adhesive may be a silicone adhesive such as, for example, Sylgard® by Dow Corning. The adhesive is dispensed onto the top portion 10 of the distribution structure 15 only in locations surrounding the fluid inlet holes 20, 20' and fluid outlet holes 30. It is essential to avoid dispensing any adhesive into the inlet and outlet holes. The manifold 40 and distributor 15 are then contacted to one another, and the manifold is bonded to the distributor, such as, by curing or pressure bonding.

Figure 4:
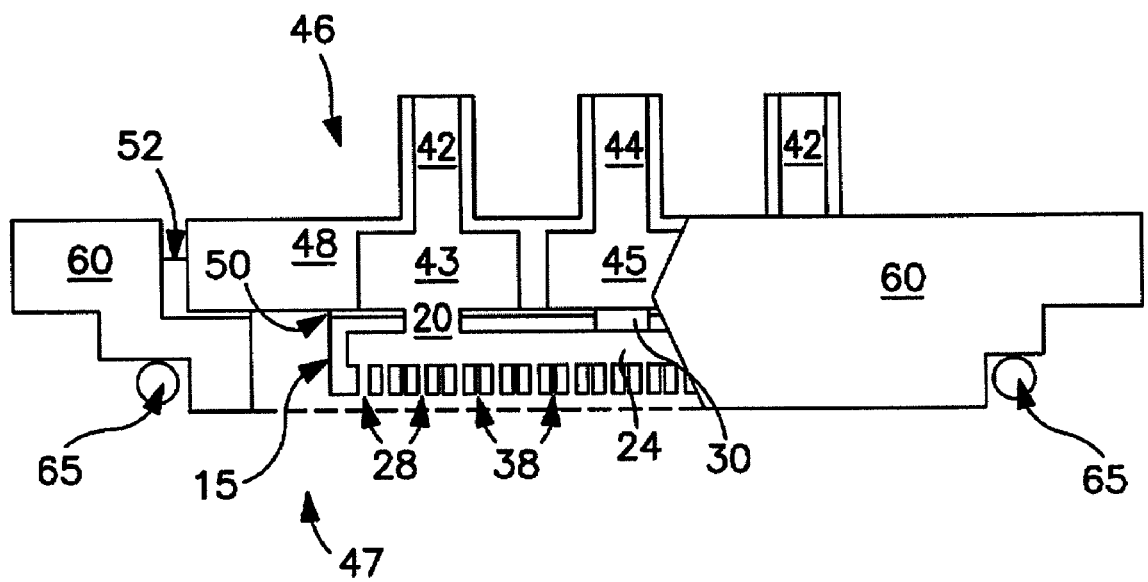
FIG. 4 is a side view showing a frame attached to the fluid distributor-manifold subassembly of FIG. 3.

Referring to FIG. 4, a second subassembly is formed by attaching a frame 60 to the subassembly comprising the metal manifold 40 attached to the fluid distribution structure 15. For illustration purposes only, FIG. 4 shows a partial view of the frame 60 attached to the assembly of FIG. 3, however, it should be appreciated that the frame 60 is provided entirely around the manifold-distributor assembly. This partial view depicts both an internal view of the frame 60 attached to the module 40, to the left of the illustration, and an external view of the frame 60, to the right of the illustration. It is to be understood that these internal and external views encompass the entire subassembly. It should be understood that these assembly components and the distributor structure 15 may have different TCEs.

The frame 60 is securely sealed to the manifold-distributor assembly such that no leakage of fluids occurs between a top surface 46 and a bottom surface 47 of the manifold-distributor assembly. This is preferably accomplished using adhesive 52 having suitable strength for sealing the manifold-distributor assembly to the frame, such as, a silicone adhesive. The frame 60 has an opening with a lip for receiving and holding the edges of the metal manifold 40. The adhesive is dispensed within the frame opening onto the frame opening lip. The manifold 40 is then contacted with the frame opening lip and bonded to the frame, such as by curing or pressure bonding, whereby adhesive 52 is forced up sidewalls of the frame opening and along the opening lip for securely bonding the manifold-distributor assembly to the frame. This bond completely seals the connection between the manifold-distributor assembly and the frame to prevent leakage of fluids from the fluid inlet 42, 42' and outlet 44 pipes at the top surface 46 of the assembly to the bottom surface 47 of such assembly.

Figure 5:
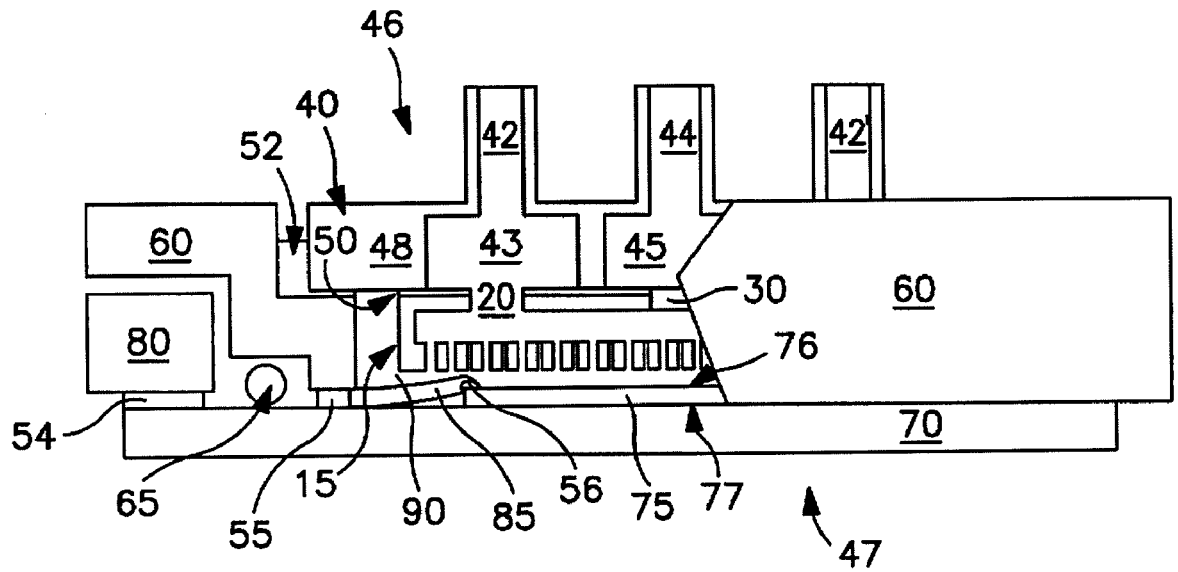
FIG. 5 is a side view of a low-pressure drop thermal assembly of the invention whereby the structure of FIG. 4 within a housing frame and sealed to a substrate, such as a chip carrier, having on a surface thereof a semiconductor device in need of thermal management.

Referring now to FIG. 5, the low-pressure drop thermal assembly is then completed by attaching the subassembly of FIG. 4 to a chip carrier 70 having thereon a semiconductor device 75 that includes hierarchy (i.e., semiconductor device components) in the need of thermal management including, but not limited to, chips, interconnects, modules, integrated circuits, transistors, resistors, and the like. These components reside on a bottom side 77 of the semiconductor device, which is in contact with the top side of the chip carrier 70. Temperatures of these semiconductor device components are thermally controlled by directly impinging cooling fluid, heated fluid, or combinations thereof, through the fluid microjets 28 onto the exposed top side 76 of the semiconductor device 75.

The chip carrier 70 is sealed to a housing frame 80 of the low-pressure drop thermal assembly using an adhesive 54, as shown by the internal view depicted to the left of FIG. 5. Adhesive 54 has suitable strength for directly bonding the chip carrier to the housing frame, preferably without any additional mechanical constraint, thereby accommodating for height tolerances between the top side 76 of the semiconductor device 75 and the bottom of the distributor 15. In the preferred embodiment, the adhesive 54 is an epoxy adhesive.

The interconnection between the frame 60 and the chip carrier 70 is then sealed to encapsulate the semiconductor device 75 within a cavity 90. An essential feature of the invention in sealing the frame 60 to the chip carrier 70 is that moisture is prevented from escaping cavity 90 and potentially coming into contact with the bottom side of the chip carrier 70. Preferably, an "O" ring 65 is used to seal the frame to the chip carrier, whereby the "O" ring 65 entirely surrounds the frame 60.

Upon sealing the frame to the chip carrier, the cavity 90 resides between the bottom side of the manifold-distributor assembly, the top side of the chip carrier 70 and sidewalls of frame 60 residing there-between. Cavity 90 includes a gap area residing between the bottom of the distributor 15 and the top surface of the semiconductor device 75. This gap area is essential for achieving maximum heating/cooling of the target surface. The gap area has a gap height since it is undesirable for the bottom of the distributor 15 to contact the top surface of the semiconductor device 75. The gap height is determined based on both microjet diameters and the distance between adjacent microjets. Once the required gap height is determined, such gap height is achieved by mounting the frame 60 to the substrate 70 to attain the required gap height for sufficient heating and/or cooling of the target surface.

In the step of sealing the frame 60 to the chip carrier 70, an adhesive 55 may be used in combination with the "O" ring 65. This adhesive 55 is provided directly between the frame 60 and the chip carrier 70 for bonding the assembly together, and further preventing any leakage of fluids from cavity 90. Adhesive 55 is preferably a flexible silicone adhesive.

Another alternative to the use of only "O" ring 65 is to provide a thin, flexible metal plate 85 entirely around the semiconductor device 75. In so doing, adhesive 55 bonds the frame 60 to the chip carrier 70, and also bonds the thin, flexible metal plate 85 at a first end thereof to the thermal assembly. A second, opposing end of the metal plate 85 is bonded to a top side edge of the semiconductor device 75 using adhesive 56, which is also preferably a flexible silicone adhesive. This thin, flexible metal plate 85 is advantageous for preventing any fluid and/or moisture from contacting the bottom side 77 of the semiconductor device having the components in need of thermal management.

As yet another alternative, the area between the bottom side of the semiconductor device 75 and the top of the chip carrier 70 may be underfilled, using a suitable underfill material such as a polyimide, to even further protect the bottom side components of the semiconductor device. It should be appreciated that the foregoing attachment means may be used as discussed above, or alternatively, in any possible combination thereof.

Figure 6:
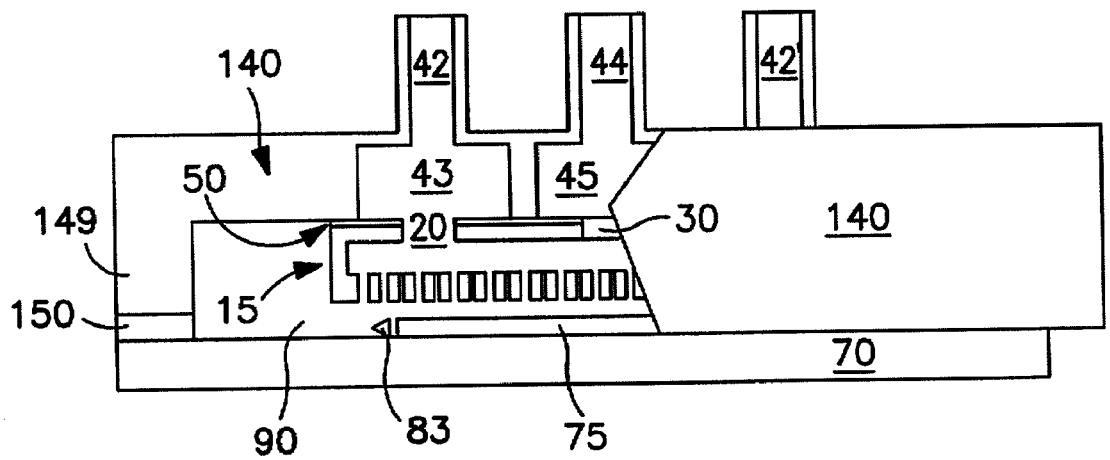
FIG. 6 is a side view of an alternate embodiment of a low-pressure drop thermal assembly of the invention whereby the metal manifold is fabricated to include downward extending sidewalls, which are directly attached to the substrate having the semiconductor device in need of thermal management.

Referring to FIG. 6, an alternative embodiment of the invention is shown whereby the metal manifold 140 includes downward extending sidewalls 149, which are attached to the substrate 70 to form cavity 90. In this aspect of the invention, the metal manifold 140 is directly attached to the substrate 70 such that frame 60 and housing frame 80 are eliminated. The need for sealing locations are also minimized since the only sealing location required for the low-pressure drop thermal assembly of FIG. 6 is adhesive 150, which is preferably a flexible silicone adhesive. Adhesive 150 prevents leakage of fluids from cavity 90, and thus, protects the bottom side of the chip carrier 70 at the bottom surface of the thermal assembly from moisture. The sidewalls 149 of the metal manifold 140 are formed to a height that accommodates for the determined gap height between the distributor 15 and the target surface of the semiconductor device 75 for achieving maximum heating/cooling of such target surface. As is shown, the semiconductor device 75 may be underfilled with an underfill material 83 for added protection against moisture.

In any embodiment of the invention, the low-pressure drop thermal assemblies manage a temperature of the semiconductor device by providing cooling fluid into the fluid inlet pipes 42, 42', which is then introduced into the fluid inlet openings 43, 43' of the manifold. The cooling fluid travels through fluid inlet holes 20, 20' of the distributor and then into the y-axis inlet channels 24, 24'. The cooling fluid is then forced out of the fluid inlet microjets 28 and orthogonally impinges the heated target surface of the semiconductor device. The cooling fluid is heated upon contact with the hot semiconductor surface. This spent heated fluid is then removed from cavity 90 in a direction orthogonal to the target surface by the distributed outlet microjet drains 38 of the distributor. Spent heated fluid is forced into the y-axis outlet channel 34, through the outlet hole 30 of the distributor, and then into the fluid outlet opening 45 of the metal manifold and out the fluid outlet pipe 44. Optionally, there may be only one fluid inlet pipe and fluid inlet opening within the manifold, and one fluid outlet pipe and fluid outlet opening within such manifold.

As such, the present low-pressure drop thermal assemblies enable the input and output of fluids separate from one another, i.e., without mixing such fluids, while maintaining an internal liquid pressure drop below 10 psi. It should be appreciated that thousands of liquid impinging microjets and distributed drain returns may reside across the distributor body per square inch, whereby these microjets and returns all connected to inlet and outlet pipes of the manifold.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A low-pressure drop thermal assembly for thermal management of a semiconductor device comprising:
   a subassembly comprising a manifold directly attached to a distributor, said manifold having a fluid inlet opening integral with a fluid inlet pipe and isolated from a fluid outlet opening that is integral with a fluid outlet pipe, said distributor having a fluid inlet body intertwined with a fluid outlet body, said fluid inlet body having a fluid inlet microjet array intertwined with and isolated from a fluid outlet microjet array whereby each inlet microjet is adjacent at least three outlet microjets, said manifold being attached to said distributor such that said fluid inlet opening of said manifold communicates with said fluid inlet microjet array of said distributor and said fluid outlet opening of said manifold communicates with said fluid outlet microjet array of said distributor;
   a substrate surface in communication with said subassembly;
   a semiconductor device on said substrate surface, said semiconductor device having a first surface orthogonal to an input, output direction flow of a fluid input by said microjet input array and output by said distributed microjet outlet array, and having a second surface with hierarchy thereon connected to said substrate surface;
   a cavity residing between said subassembly and said substrate surface;
   a seal of said cavity around said semiconductor device for protecting said hierarchy from said fluid; and
   a total internal liquid pressure drop below about 10 psig through use of said distributor.

2. The assembly of claim 1 wherein said manifold body comprises a metal manifold.

3. The assembly of claim 2 wherein said distributor comprises a material selected from the group consisting of glass-ceramic material, silicon, AlN, SiC, Cu, Ni, alloys thereof, and combinations thereof.

4. The assembly of claim 1 wherein said manifold of said subassembly is attached to said substrate surface.

5. The assembly of claim 1 further including a frame around said subassembly, said frame sealed to said substrate surface to provide said cavity being a closed cavity.

6. The assembly of claim 5 wherein said frame comprises a first frame attached to said manifold and sealed to said substrate for providing said closed cavity, and a second frame attached to said substrate, said first frame residing within said second frame.

7. The assembly of claim 6 wherein said seal comprises an o-ring, said o-ring surrounding said first frame to seal said first frame to said substrate.

8. The assembly of claim 6 further including attaching said first frame to said substrate using an adhesive there-between.

9. The assembly of claim 1 wherein said seal comprises a flexible plate within said cavity surrounding said semiconductor device, said flexible plate protecting said hierarchy on said second surface of said semiconductor device from said fluid.

10. The assembly of claim 1 wherein said seal comprises a material encapsulating peripheral edges of said semiconductor device to protect said hierarchy on said second surface of said semiconductor device from said fluid.

11. The assembly of claim 1 wherein said inlet opening of said manifold comprises a fluid inlet opening integral with a fluid inlet pipe for inputting said fluid into said assembly, and said outlet opening of said manifold comprises a fluid outlet opening integral with a fluid outlet pipe for outputting said fluid from said assembly.

12. The assembly of claim 11 wherein said distributor comprises,
   a fluid inlet manifold having at least one fluid inlet hole connected to a fluid inlet channel which opens into said inlet microjet array,
   a fluid outlet manifold having at least one fluid outlet hole connected to a fluid outlet channel which opens into said outlet microjet array,
wherein said manifold is attached to said distributor by said at least one fluid inlet hole within said distributor being connected to said fluid inlet opening of said manifold, and said at least one fluid outlet hole within said distributor being connected to said fluid outlet opening of said manifold.

13. The assembly of claim 1 wherein said distributor is capable of controlling a temperature at a rate above about 100 W/cm$^2$ while maintaining a total internal liquid pressure drop below about 10 psig.

14. A system for thermal transfer comprising:
   a manifold body having an inlet opening isolated from an outlet opening;
   a distributor having a fluid inlet body intertwined with a fluid outlet body, said fluid inlet body having an inlet microjet array parallel with, intertwined with and isolated from an outlet microjet array of said fluid outlet body, said manifold body attached to said distributor such that said inlet opening of said manifold communicates with said inlet microjet array of said fluid inlet body of said distributor and said outlet opening of said manifold communicates with said outlet microjet array of said fluid outlet body of said distributor, said distributor controlling a temperature at a rate above about 100 W/cm$^2$ while maintaining an internal liquid pressure drop;
   a substrate having a substrate surface in communication with said manifold body;
   a semiconductor device on said substrate surface having a temperature in need of modulating;
   an enclosed cavity residing between said manifold body and said substrate surface and around said semiconductor device;
   a seal of said enclosed cavity around said semiconductor device; and
   a total internal liquid pressure drop below about 10 psig through use of said distributor,
whereby a fluid flows into said manifold body through said inlet opening into said inlet microjet array of said distributor and orthogonally impinges a first surface of said semiconductor device, spent fluid flow is removed from said enclosed cavity in a direction orthogonal to said first surface by uptake into said outlet microjet array through said outlet opening and out said manifold body, wherein said seal protects hierarchy residing on a second surface of said semiconductor device.

15. The system of claim 14 wherein a first frame attached to said manifold body and sealed to said substrate surface for providing said enclosed cavity, and a second frame attached to said substrate surface, said first frame residing within said second frame.

16. The system of claim 15 wherein said seal comprises an o-ring, said o-ring surrounding said first frame to seal said first frame to said substrate.

17. The system of claim 14 wherein said seal comprises a flexible plate within said enclosed cavity surrounding said semiconductor device, said flexible plate protecting said hierarchy on said second surface of said semiconductor device from said fluid.

18. The system of claim 14 wherein said seal comprises a material encapsulating peripheral edges of said semiconductor device to protect said hierarchy on said second surface of said semiconductor device from said fluid.

19. A method of forming a thermal assembly for thermal management of a semiconductor device comprising:
   providing a manifold body having an inlet opening isolated from an outlet opening;
   providing a distributor having a fluid inlet body intertwined with a fluid outlet body, said fluid inlet body having a fluid inlet body having a fluid inlet microjet array and a fluid outlet body having a fluid outlet microjet array, said fluid inlet microjet array is parallel with, intertwined with and isolated from said fluid outlet microjet array, whereby each inlet microjet is adjacent at least three outlet microjets;
   aligning said inlet opening of said manifold with said inlet microjet array of said fluid inlet body of said distributor, and said outlet opening of said manifold with said outlet microjet array of said fluid outlet body of said distributor;
   attaching said manifold body to said distributor to form a subassembly;
   providing a substrate having on a surface thereof a semiconductor device in need of thermal control;
   attaching said subassembly to said substrate such that a cavity is formed between said subassembly and said substrate surface;
   providing a seal of said cavity around said semiconductor device for protecting hierarchy residing on a second surface of said semiconductor device; and said distributor controlling a temperature of said thermal assembly at a rate above about 100 W/cm² while maintaining a total internal liquid pressure drop below about 10 psig, whereby a fluid flows into said manifold body through said inlet opening into said inlet microjet array of said distributor and orthogonally impinges a first surface of said semiconductor device, spent fluid flow is removed from said enclosed cavity in a direction orthogonal to said first surface by uptake into said outlet microjet array through said outlet opening and out said manifold body, wherein said seal protects hierarchy residing on a second surface of said semiconductor device.

20. The method of claim 19 wherein said seal is selected from the group consisting of an o-ring, an adhesive, a flexible plate within said cavity surrounding said semiconductor device, an encapsulant within said cavity surrounding said semiconductor device, or combinations thereof.

21. A method of forming a thermal assembly for thermal management of a semiconductor device comprising:
providing a manifold body comprising a metal material having a fluid inlet opening isolated from a fluid outlet opening;
providing a distributor having a fluid inlet body intertwined with a fluid outlet body, said fluid inlet body having a fluid inlet microjet array parallel with, intertwined with and isolated from a fluid outlet microjet array of said fluid outlet body, whereby each fluid inlet microjet is adjacent at least three fluid outlet microjets, said distributor comprising a material selected from the group consisting of glass-ceramic material, silicon, AlN, SiC, Cu, Ni, alloys thereof, and combinations thereof, said distributor controlling a temperature at a rate above about 100 W/cm² while maintaining a total internal liquid pressure drop below about 10 psig;
aligning said fluid inlet opening of said manifold with said fluid inlet microjet array of said fluid inlet body of said distributor, and said fluid outlet opening of said manifold with said fluid outlet microjet array of said fluid outlet body of said distributor;
attaching said manifold body to said distributor to form a subassembly having said fluid inlet opening of said manifold communicating with said fluid inlet microjet array of said fluid inlet body of said distributor and said fluid outlet opening of said manifold communicating with said fluid outlet microjet array of said fluid outlet body of said distributor;
providing a substrate having on a surface thereof a semiconductor device in need of thermal control;
attaching said subassembly to said substrate such that a cavity is formed between said subassembly and said substrate surface; and
providing an o-ring seal of said cavity around said semiconductor device for protecting hierarchy residing on a second surface of said semiconductor device, whereby a fluid flows into said manifold body through said inlet opening into said inlet microjet array of said distributor and orthogonally impinges a first surface of said semiconductor device, spent fluid flow is removed from said enclosed cavity in a direction orthogonal to said first surface by uptake into said outlet microjet array through said outlet opening and out said manifold body, wherein said seal protects hierarchy residing on a second surface of said semiconductor device.

* * * * *